United States Patent [19]
Iyer et al.

[11] Patent Number: 5,917,213
[45] Date of Patent: Jun. 29, 1999

[54] DEPLETION COMPENSATED POLYSILICON ELECTRODES

[75] Inventors: Ravi Iyer, Boise; Luan Tran, Meridian, both of Id.; Charles L. Turner, Tempe, Ariz.

[73] Assignee: Micron Technology, Inc., Boise, Id.

[21] Appl. No.: 08/916,024

[22] Filed: Aug. 21, 1997

[51] Int. Cl.$^6$ .................................................. H01L 27/108
[52] U.S. Cl. .......................... 257/309; 257/306; 257/310
[58] Field of Search ..................................... 257/306, 309, 257/310

[56] References Cited

U.S. PATENT DOCUMENTS

| Re. 35,420 | 1/1997 | Cathey et al. . |
|---|---|---|
| 4,996,081 | 2/1991 | Ellul et al. . |
| 5,032,545 | 7/1991 | Doan et al. . |
| 5,032,892 | 7/1991 | Chern et al. . |
| 5,037,773 | 8/1991 | Lee et al. . |
| 5,043,780 | 8/1991 | Fazan et al. . |
| 5,053,351 | 10/1991 | Fazan et al. . |
| 5,082,797 | 1/1992 | Chan et al. . |
| 5,089,986 | 2/1992 | Sandhu et al. . |
| 5,100,826 | 3/1992 | Dennison . |
| 5,108,943 | 4/1992 | Sandhu et al. . |
| 5,130,885 | 7/1992 | Fazan et al. . |
| 5,138,411 | 8/1992 | Sandhu . |
| 5,182,232 | 1/1993 | Chhabra et al. . |
| 5,202,278 | 4/1993 | Mathews et al. . |
| 5,208,176 | 5/1993 | Ahmad et al. . |
| 5,262,343 | 11/1993 | Rhodes et al. . |
| 5,278,091 | 1/1994 | Fazan et al. . |
| 5,318,920 | 6/1994 | Hayashide . |
| 5,340,763 | 8/1994 | Dennison . |
| 5,340,765 | 8/1994 | Dennison et al. . |
| 5,349,494 | 9/1994 | Ando . |
| 5,362,666 | 11/1994 | Dennison . |
| 5,429,972 | 7/1995 | Anjum et al. . |
| 5,608,247 | 3/1997 | Brown ..................................... 257/306 |
| 5,760,434 | 6/1968 | Zahurak et al. ......................... 257/309 |

OTHER PUBLICATIONS

Ino, et al., "Silicon Nitride Thin–Film . . . " IEEE Transaction on Electron Devices, vol. 41, No. 5, May 1994; pp. 703–707.

"Impact of Surface Proximity Gettering and Nitride Oxide Side–Wall Spacer by Nitrogen Implantation on Sub–Quarter Micron CMOS LDD FETs", Shimizu, et al., incomplete citation IEDM–95 pp. 859–862.

*Primary Examiner*—Gene M. Munson
*Attorney, Agent, or Firm*—Knobbe, Martens, Olson & Bear, LLP

[57] ABSTRACT

A capacitor in a semiconductor integrated circuit is fabricated having a fixed charge density introduced near an electrode/dielectric interface. The fixed charge density compensates for the effects of a depletion layer, which would otherwise lower the effective capacitance. By shifting the undesirable effect of the depletion capacitance outside of the operating voltage range, the capacitor is effectively converted to an accumulation mode. The fixed charge density is preferably introduced by a plasma nitridation process performed prior to formation of the capacitor dielectric.

8 Claims, 8 Drawing Sheets

DEPLETION COMPENSATED POLYSILICON ELECTRODES

FIELD OF THE INVENTION

The invention relates generally to semiconductor circuit memory storage devices and more specifically to the charge storage capability of the capacitors in VLSI memory arrays such as dynamic random access memories (DRAM).

BACKGROUND OF THE INVENTION

With the advancement of microfabrication technology, semiconductor integrated device density is continuing to increase, and in particular for Dynamic Random Access Memory (DRAM) arrays. In light of the reduction in device dimensions, the charge storage capability of the capacitors in DRAM cells has become an important issue. The minimum requirements for charge storage, charge sensing, and refresh rate for practical memory applications often results in the cell capacitor being one of the largest DRAM circuit components. Thus, the drive to produce higher capacity DRAM circuitry has give risen to much capacitor development. Moreover, the increasing complexity of VLSI fabrication often entails the use of multilayer structures above the silicon substrate. Therefore, electrical and metallurgical properties of multilayer structures have an important effect on the circuit performance and reliability.

A DRAM basically comprises a multiplexed array of charge storage cells, each cell comprising a capacitor connected to an access device such as a field effect transistor. In such designs, the capacitor electrode which is connected to the access device is generally called the "storage node" or "storage poly" since the material out of which it is formed is often conductively doped polysilicon. The capacitor counter electrode, usually connected to a reference voltage, is called the "cell plate electrode" or "cell poly plate" as it is also often comprised of doped polysilicon. Polysilicon used for capacitor electrodes is typically moderately doped at densities greater than about $10^{19}$ cm$^{-3}$ for good conductivity.

In practice, roughened or texturized polysilicon layers are used to increase the effective surface area of the capacitor plates, thereby achieving higher stored charge per unit area of the underlying substrate. To construct such a storage cell, a conductively doped first layer of polysilicon (poly or polycrystalline silicon) is deposited on a wafer. Thereafter, a second polysilicon layer may be deposited and formed into roughened, so-called Hemispherically-Grained Silicon (HGS) thereby forming a capacitor plate having a textured surface morphology. A capacitor dielectric is typically conformally deposited on the HGS poly surface, with the roughened electrode surface providing an enhanced capacitor area. Capacitor dielectrics may for example comprise silicon dioxide or nitride or compositions thereof formed by chemical vapor deposition processes at temperatures ranging from 600° C. to 1000° C. A subsequent polysilicon deposition on the dielectric film forms the second capacitor electrode.

A common problem associated with the aforementioned capacitor fabrication process is the lack of sufficient outdiffusion of dopants from the doped poly into the HSG during subsequent high temperature processing, resulting in a depletion region adjacent to the cell dielectric. The effect of this depletion region introduces an additional "depletion" capacitance in series with the dielectric capacitance, which causes a substantial reduction in the effective capacitance of the storage capacitor.

Clearly, as the lateral dimensions of DRAM capacitors are reduced, performance must increase to meet minimum charge storage criterion. Thus, there is a clear need in the industry to increase DRAM cell capacitance by reducing the effects of dopant depletion.

SUMMARY OF THE INVENTION

One object of the present invention is to provide an integrated circuit capacitor having improved charge storage capability. Increased capacitance is advantageous for applications in capacitor memory arrays such as DRAM arrays. Another object of the present invention is to provide a technique for compensating the effects of depletion in conductively doped polysilicon electrodes, such as used in DRAM storage capacitors.

In accordance with one aspect of the present invention, a capacitor in an integrated circuit comprises an electrode having a fixed or immobile charge density distributed throughout a surface region of the electrode. A dielectric layer is disposed adjacent to the surface region and a second electrode is disposed adjacent to the dielectric layer. The electrodes of the capacitor preferably comprise conductively doped polysilicon and the fixed charge density is preferably incorporated by a plasma nitridation process. Furthermore, the electrodes of such a capacitor preferably have a textured surface morphology and the dielectric layer preferably comprises silicon nitride. The capacitor of the present invention should have a capacitance greater than about 5 fF/$\mu$m$^2$, preferably greater than about 10 fF/$\mu$m$^2$, and most preferably between about 15 and 80 fF/$\mu$m$^2$.

In accordance with another aspect of the present invention, a process for fabricating a capacitor in an integrated circuit comprises the steps of forming a first electrode and then introducing a fixed charge density into a top surface region of the first electrode. The capacitor is then formed by depositing a dielectric layer over and directly contacting the top surface region of the first electrode and then depositing a second electrode over and directly contacting the dielectric layer. The process preferably comprises forming at least the first electrode from conductively doped polysilicon having a textured surface morphology. The fixed charge density is advantageously introduced into the top surface region of the first electrode by a plasma nitridation process followed by a chemical vapor deposited silicon nitride dielectric layer. The second capacitor electrode is also preferably formed by depositing conductively doped polysilicon.

In accordance with yet another aspect of the present invention a method of increasing the capacitance of a capacitor in an integrated circuit comprises forming a first capacitor electrode and subsequently introducing a fixed charge density into a top surface region of the first capacitor electrode. The method further comprises depositing a dielectric layer directly over the top surface region of the first capacitor electrode and subsequently depositing a second capacitor electrode over and directly contacting the dielectric layer. The capacitor electrodes are preferably comprised of conductively doped polysilicon and the fixed charge density is preferably introduced into the first electrode by exposing the top surface region to a plasma comprising ammonia and nitrogen complexes.

These and other aspects and attributes of the present invention will be made more apparent by the following detailed description and accompanying figures.

DETAILED DESCRIPTION OF THE INVENTION

Although the preferred embodiment of the present invention is disclosed in the context of a stacked capacitor DRAM fabrication process, it will be appreciated that the principles and techniques herein disclosed may be applied to other semiconductor devices and fabrication processes where a depletion layer capacitance may be encountered such as with polysilicon contacts and interconnects.

Figure 1:
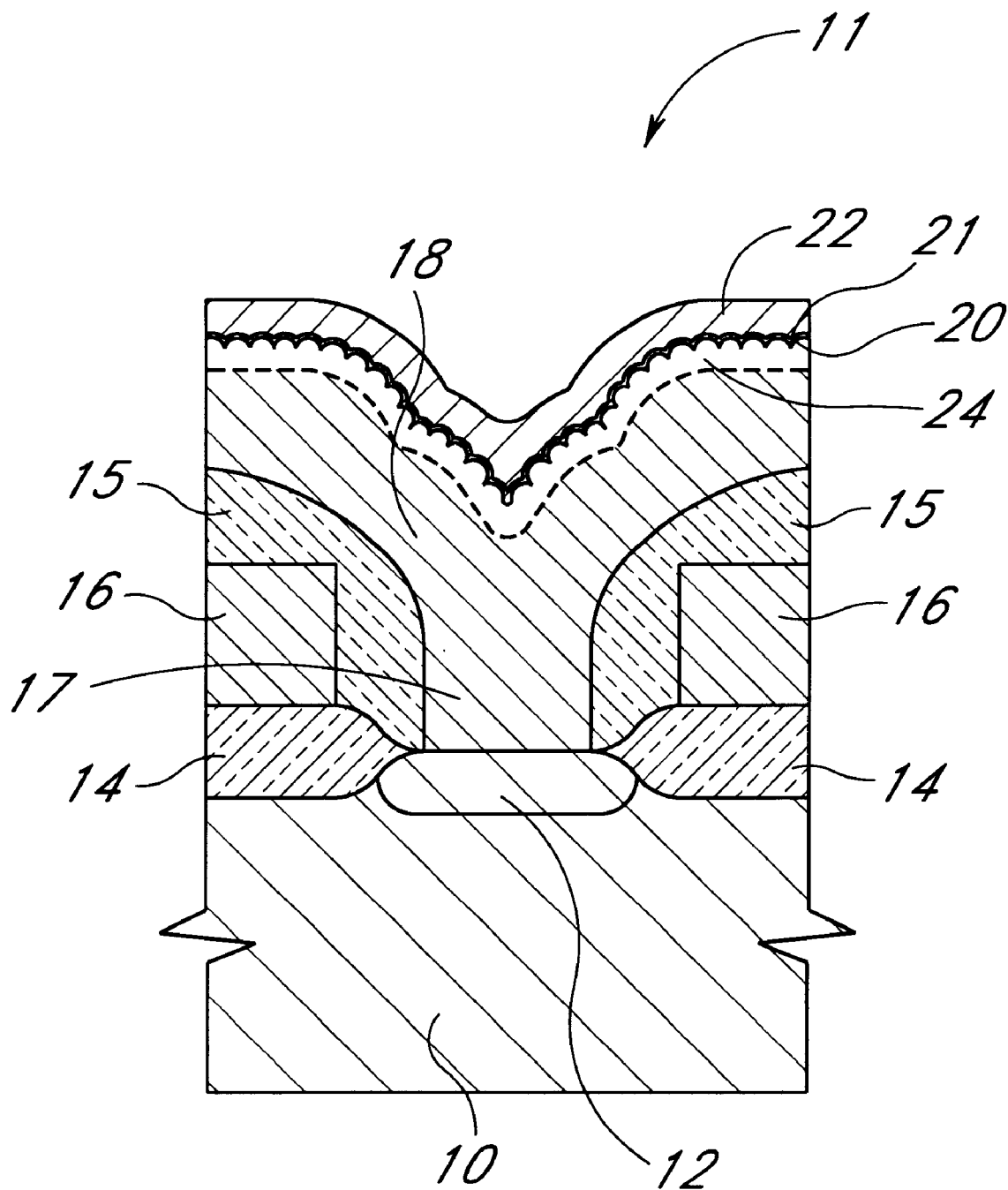
FIG. 1 is a sectional view of an exemplary prior art capacitor cell.

Referring now to FIG. 1, a silicon wafer has been fabricated up to a point having capacitor storage cell(s) 11, for example in a DRAM memory array. A conventional fabrication process to develop a capacitor cell may develop field oxide regions 14 separating digit lines 16 from the silicon substrate 10. Digit lines are isolated by surrounding dielectric layers 15. A contact/container opening 17 has been created, thus providing access to active areas 12. After contact/container opening 17 has been formed, a doped polysilicon layer is deposited to fill container/contact opening 17, thus forming the polysilicon storage node 18. The polysilicon layer is often conductively doped using phosphorous (n-doped) to densities typically greater than about $10^{19} cm^{-3}$, producing a high conductivity desirable for capacitor electrodes. Further, the surface 20 of the polysilicon storage node 18 may be textured by known methods to provide greater surface area, thereby increasing the stored charge. The basic capacitor structure is completed by forming a capacitor dielectric layer 21, such as silicon nitride ($Si_3N_4$), over the storage node surface 20, and a cell plate 22 forming the capacitor counter electrode over the dielectric layer 21.

Figure 2:
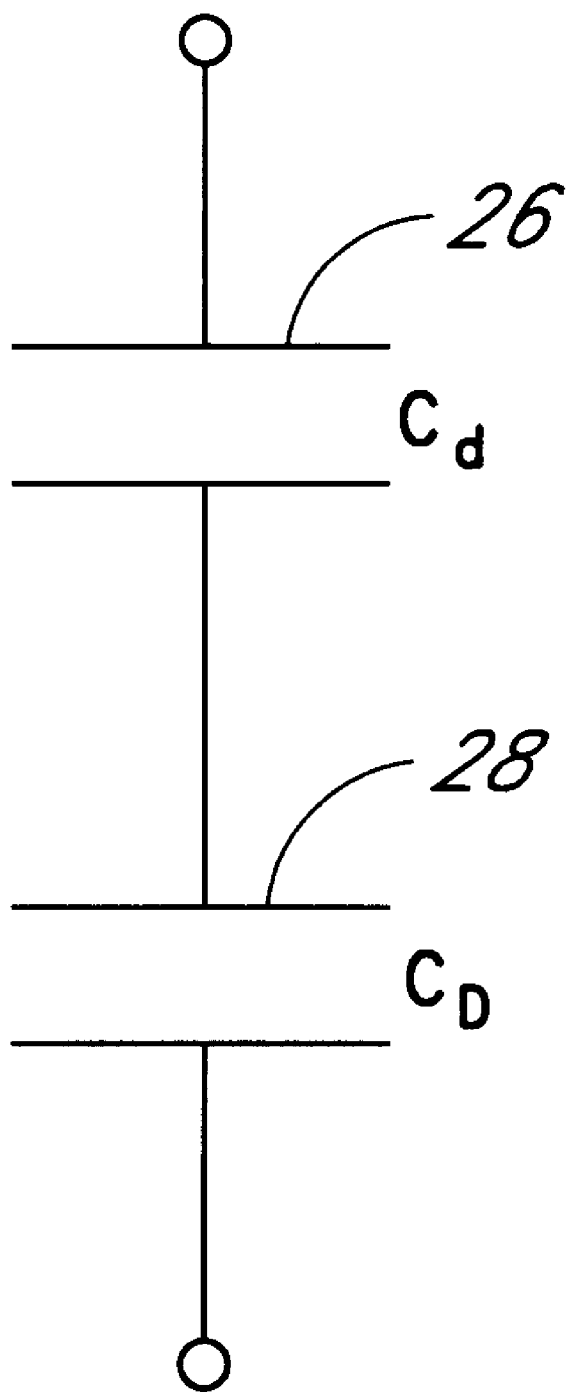
FIG. 2 is a schematic equivalent circuit for a cell capacitor having a depletion layer capacitance in series with the dielectric capacitance.

A common problem encountered in the formation of such capacitors is a parasitic depletion layer capacitance formed in a region 24 of the polysilicon storage node 18, adjacent to the capacitor dielectric 21. Specifically, in conventional processing, when for example process steps are performed to grow a nitride dielectric layer, elevated process temperatures often ranging between 700° C.–1000° C. may cause a dopant out-diffusion from the polysilicon storage node 18 into the dielectric layer 21. As a result of this out-diffusion, a depletion region 24 in the polysilicon is created adjacent to the cell dielectric. The depletion region may also result from insufficient out-diffusion from a polysilicon electrode substrate into a subsequently formed HSG layer. Regardless of its source, the effect of the depletion region 24 is to introduce an additional capacitance, $C_d$ (26) in series with the dielectric capacitance $C_D$ (28) as shown schematically in FIG. 2. Thus, the total capacitance is reduced by the series combination as $C=C_d C_D/C_d+C_D$.

Figure 3:
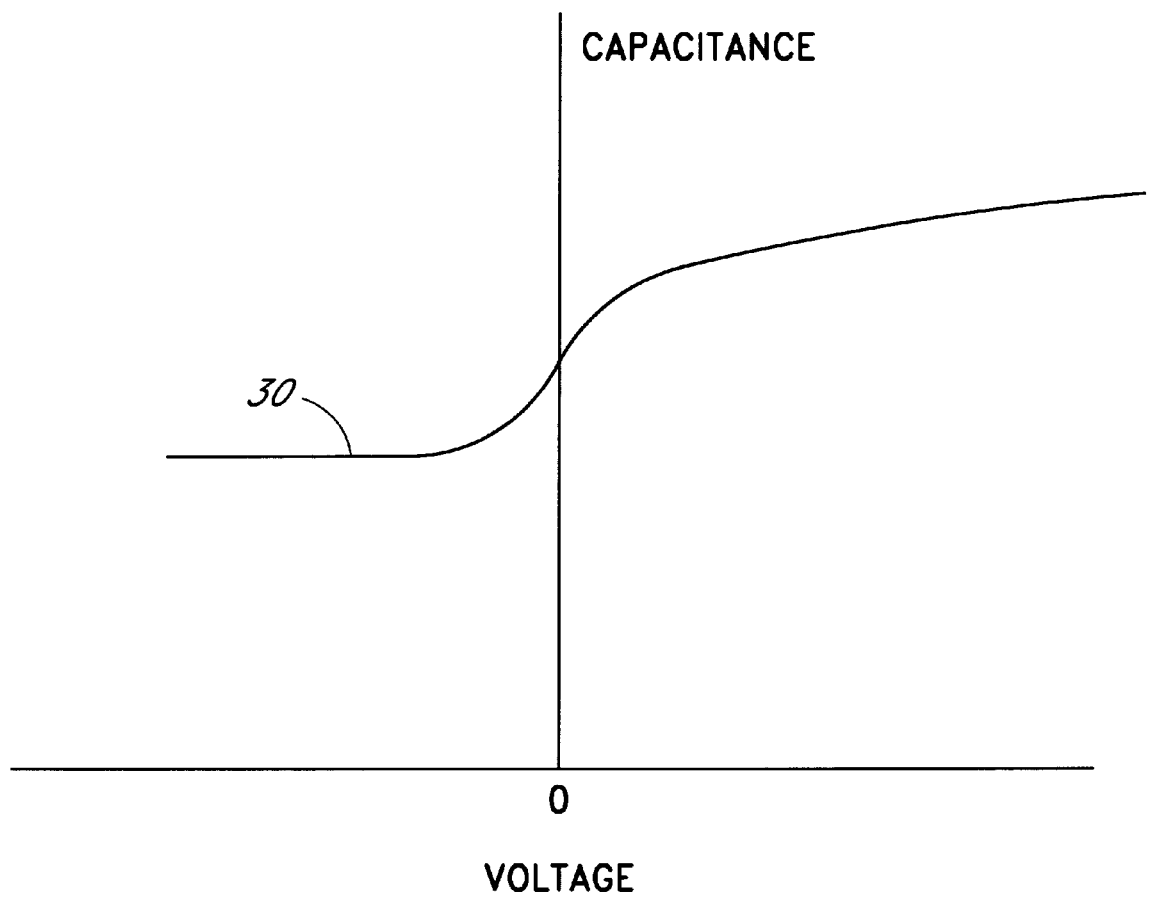
FIG. 3 is a schematic graph of the capacitance-voltage characteristics for an exemplary prior art capacitor.

As shown in FIG. 3, the capacitance-voltage characteristic 30 of an exemplary storage cell having a depleted layer 24 as shown in FIG. 1 typically displays a reduced capacitance over a range of bias potentials. In the present embodiment, the C-V curve 30 is relatively constant for positive bias voltages, where the capacitance is substantially that of the dielectric. However, for negative bias voltages the capacitance of the storage cell decreases, which is attributed to the polysilicon depletion layer capacitance 26 in series with dielectric capacitance 28.

In accordance with the principles of the present invention the introduction of fixed or immobile charge into the capacitor electrode/dielectric interface region during dielectric deposition contributes substantially to reduce deleterious effects of the polysilicon depletion layer capacitance, thereby increasing charge storage capability of the capacitor. The term fixed charge used herein refers to stationary or otherwise immobile electric charge carriers such as ionized atomic species or bound electronic charge, in contrast to mobile charge carriers which provide charge conduction.

Figure 4:
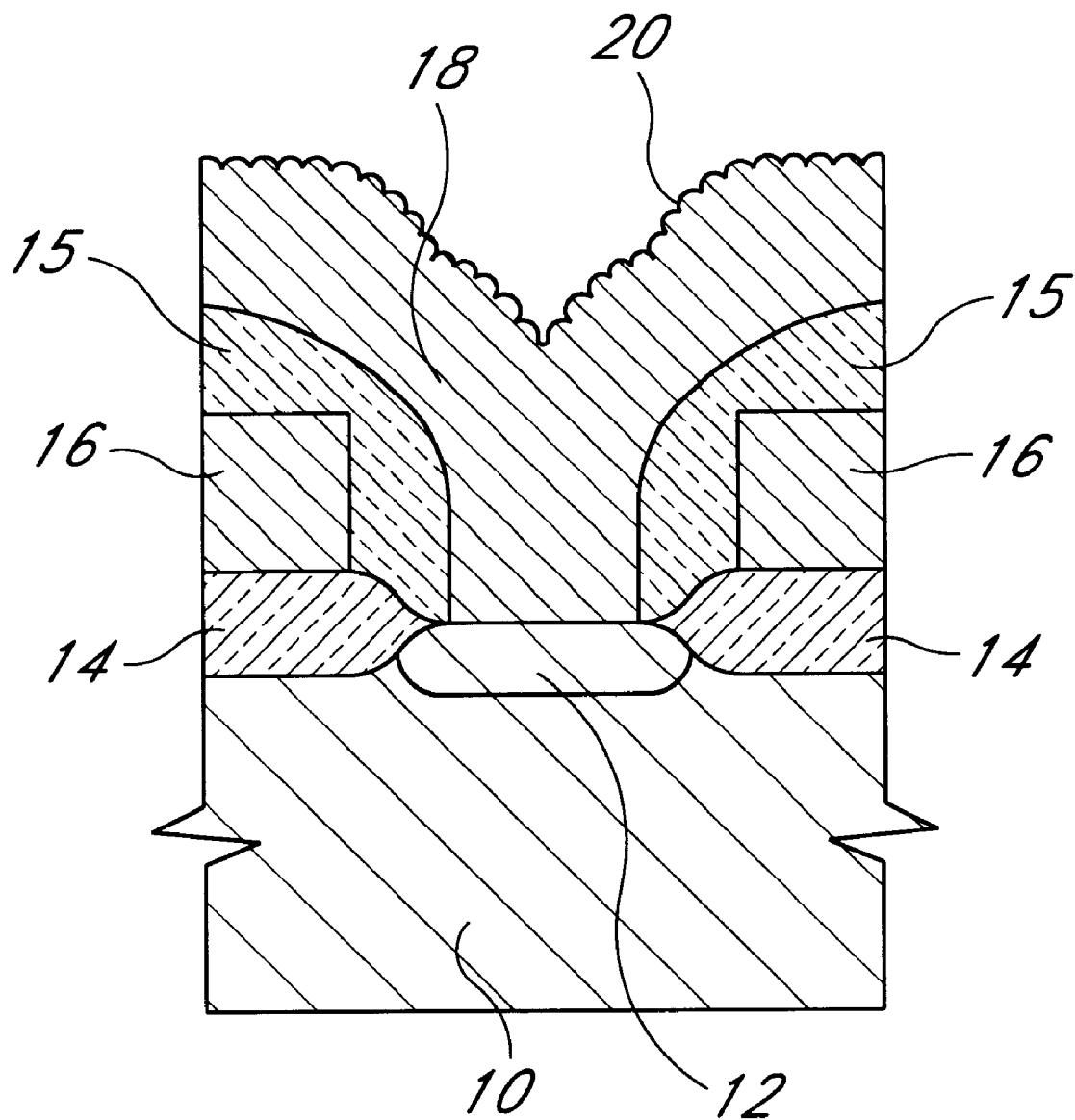
FIG. 4 is a sectional view of an exemplary capacitor bottom electrode prior to introduction of the fixed charge layer of the present invention.

A preferred embodiment of a process for introducing fixed charge into the capacitor structure first comprises completing the storage node electrode structure 18 as shown in FIG. 4. As mentioned earlier, the storage node electrode 18 is basically comprised of conductively doped polysilicon, and preferably has a textured surface morphology 20 providing enhanced capacitance. Typically, during processing a native silicon dioxide layer (not shown) can easily form at the surface of the polysilicon layer as a result of exposure to the atmosphere. The presence of this native silicon dioxide is considered unsuitable for high performance DRAM cells and therefore is preferably removed prior to fixed charge formation. One embodiment of the native oxide removal process comprises an ex-situ wet etch followed by an in-situ soft plasma sputter performed using $Ar^+$-ion bombardment. An ex-situ wet etch, may for example comprise exposing the oxidized polysilicon surface to an HF/deionized water solution well known in the art. An HF solution selectively etches the silicon dioxide layer, with an etch rate depending upon on solution concentration. Typically a 10:1 ratio of deionized water to HF at room temperature will yield an oxide etch rate of approximately 10–20 nm/min. The etching process may be followed by an alcohol vapor drying step. Following the wet-etch cleaning step, a second in-situ soft plasma sputter step is performed, preferably using a vacuum cluster tool apparatus, which enables subsequent in-situ processes in the same vacuum system. The plasma sputtering process is typically performed with a low pressure Ar ambient exposed to ionizing RF excitation. The energetic ions bombard the electrode surface, thereby removing a topmost surface layer. While the present preferred embodiment uses soft $Ar^+$-ion sputtering, it will be appreciated that other techniques may be used to complete the cleaning of the storage node surface.

Figure 5A:
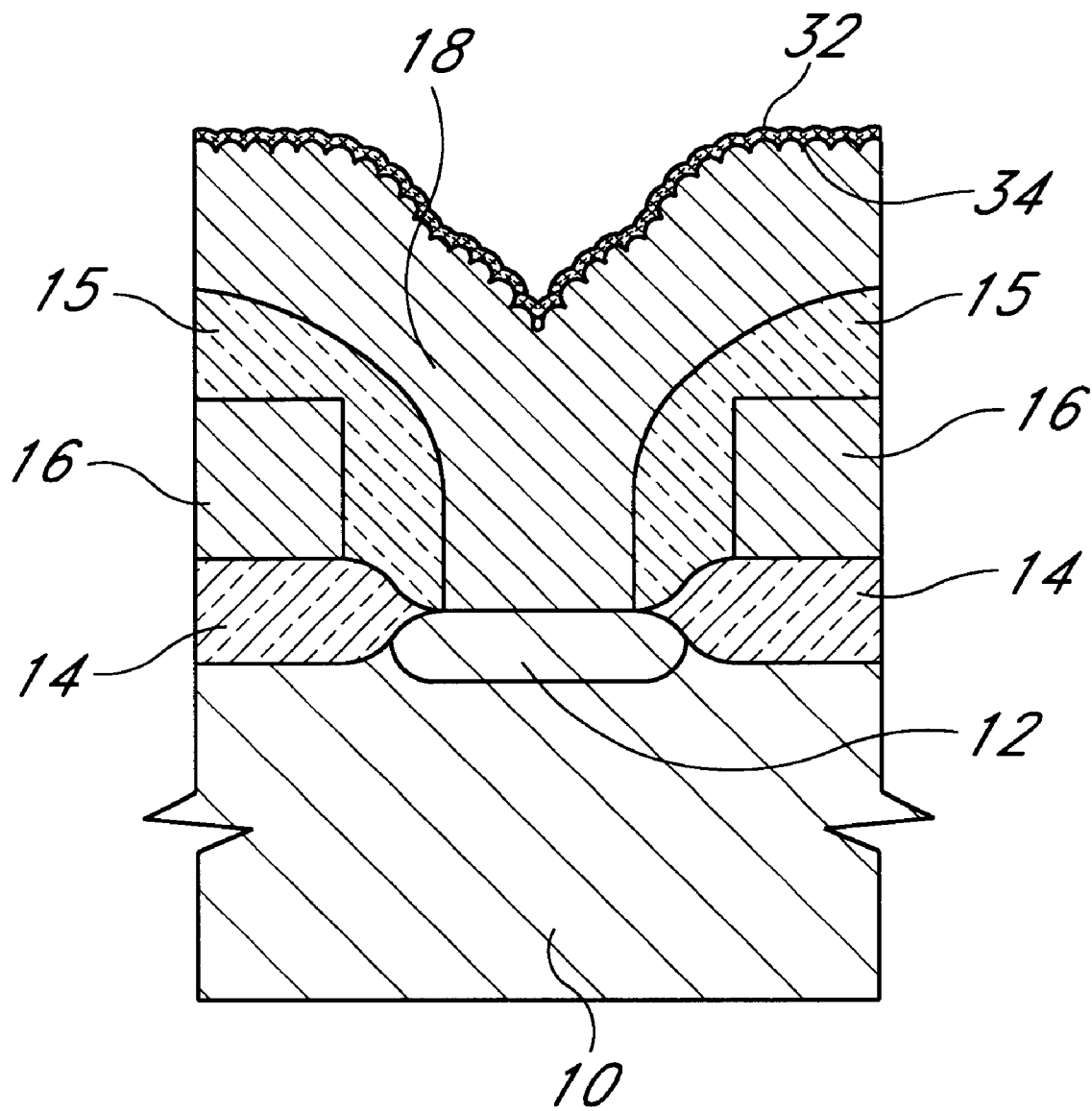
FIG. 5A is a schematic sectional view of the electrode of FIG. 4 after fixed charge introduction.

As illustrated in FIG. 5A, after providing a clean polysilicon electrode surface, a fixed charge is introduced into the polysilicon surface through a Plasma Enhanced Chemical Vapor Deposition (PECVD) process. This process converts the top 1–3 nm of polysilicon to a silicon-rich nitride layer having an embedded fixed charge density. The PECVD process comprises exposing the polysilicon surface 20 to a plasma of a suitable nitrogen-containing process gas at predetermined conditions such as ambient pressure, process gas flow rate, temperature and time. A process gas may for example comprise ammonia ($NH_3$) or more preferably a mixture of ammonia and nitrogen ($N_2$). A preferred process may have an $NH_3$ flow rate of about 50–200 sscm and a $N_2$ flow rate of about 500–2000 sscm with a plasma power of about 300–500 Watts. The storage node surface 20 is exposed to the resulting plasma at temperatures of approximately 400° C. for approximately 30 to 200 seconds. The plasma nitridation results in approximately 1–3 nm of the polysilicon being converted into a Si rich nitride layer having a fixed positive charge distributed in the layer as a result of ionized atomic species. The plasma power and exposure time may be adjusted to change the amount of fixed charge density introduced into the nitride layer. Using the present inventive process, an average charge density ranging from $10^{12}$ cm$^{-2}$ to $10^{13}$ cm$^{-2}$ has been obtained. The layer 32 resulting from the foregoing plasma nitridation process is $Si_xN_y$ which is generally found to be silicon rich and having a net positive fixed charge density $Q_f$ (34).

Figure 5B:
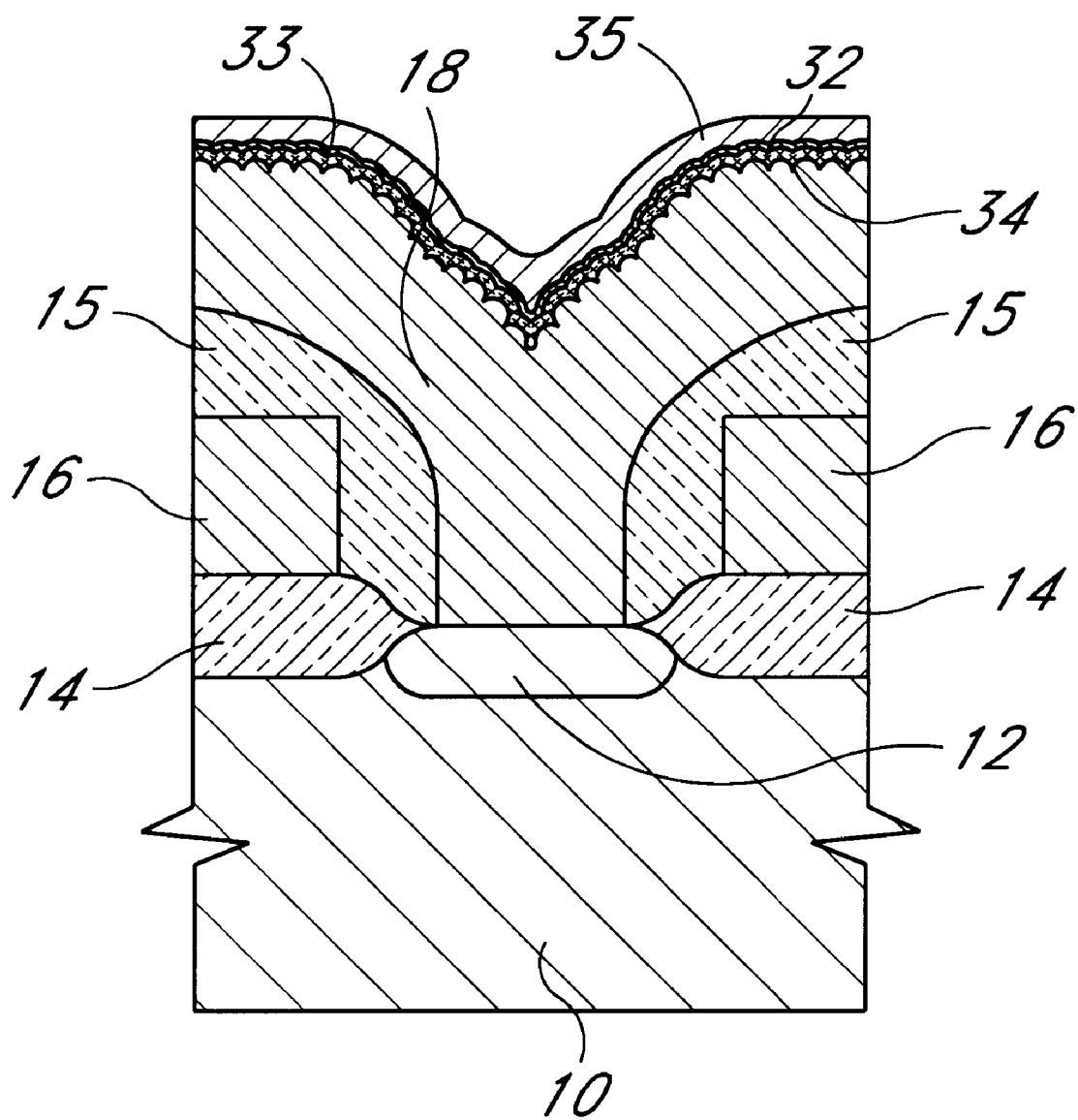
FIG. 5B a schematic sectional view of the electrode of FIG. 5A after formation of cell dielectric and upper electrode layers.

As illustrated in FIG. 5B, subsequent to introducing a layer of fixed charge density 34 into a region of the storage node electrode 18, the capacitor structure may be completed by conventional process steps. Specifically, a capacitor dielectric 33, such as silicon nitride, may be deposited over and directly contacting the fixed charge layer 32, followed by formation of a capacitor upper electrode 35, as described above in the Background section. Preferably, an oxidation step precedes the formation of the upper electrode 35, thereby filling any pinholes through the dielectric 33 with silicon oxide.

Figure 6:
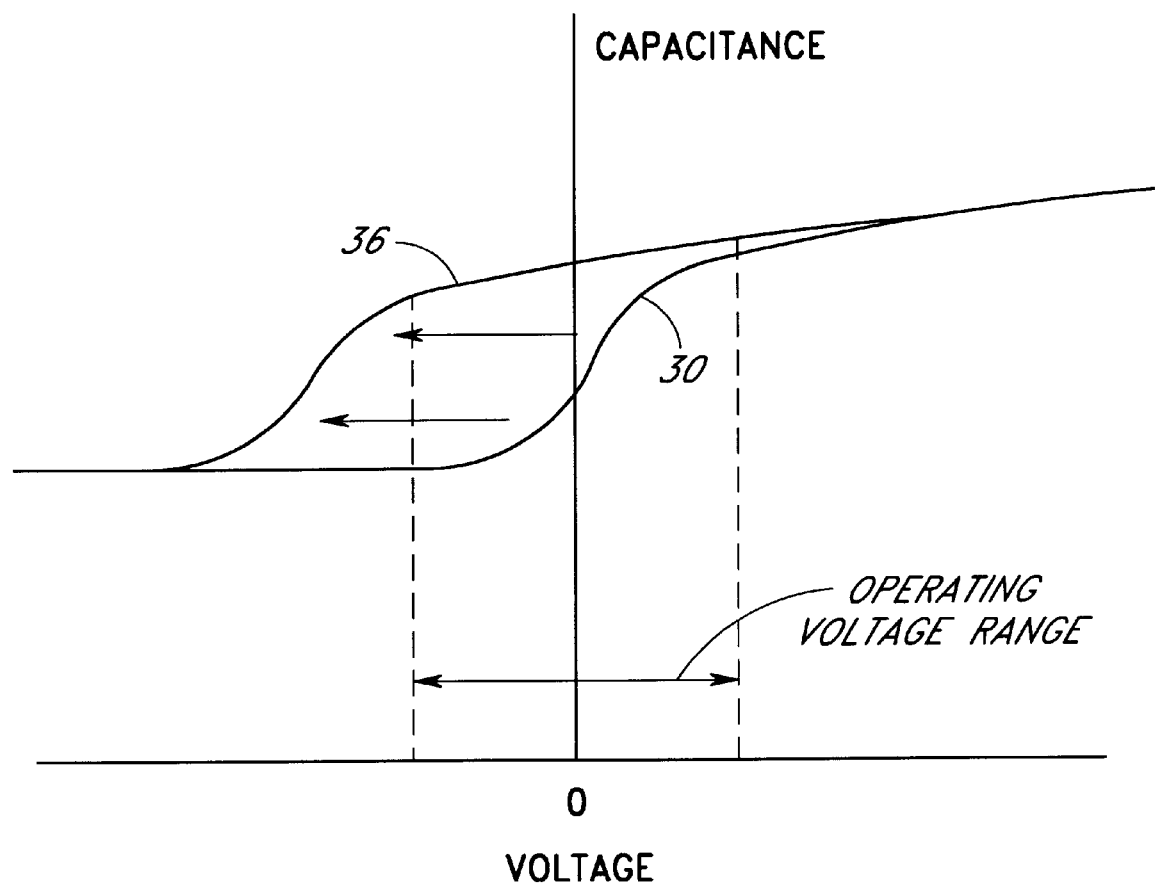
FIG. 6 is a schematic graph comparing the capacitance-voltage characteristics of capacitors with and without fixed charge introduction.

As shown in FIG. 6, presence of a fixed charge ($Q_f$) results in a change of the capacitance-voltage characteristics such that the undesirable effect of depletion is shifted by approximately $\Delta V = Q_f / C_D$. Preferably such a shift is comparable or greater than the resulting capacitor operational voltage ranges. For example, as a result of the fixed charge density $Q_f$ the C-V characteristic 30 is shifted to yield the C-V characteristic 36, which displays a relatively constant capacitance over the operating voltage range. In other words, the undesirable effect is shifted outside the operating range of biasing voltages.

Figure 7:
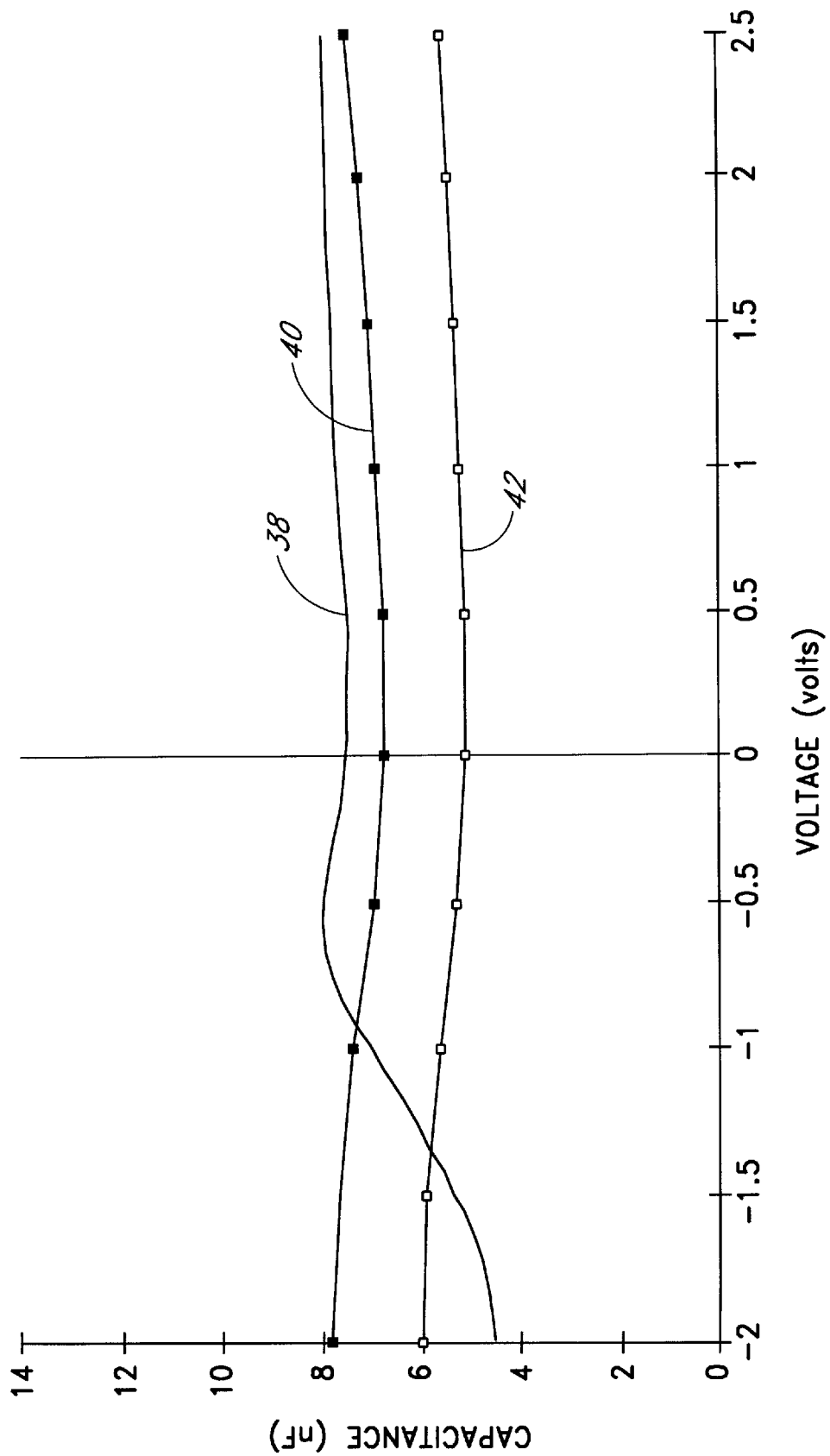
FIG. 7 is a graph comparing the capacitance-voltage characteristics of the capacitors without fixed charge to capacitors with fixed charge.

The effects of the above disclosed plasma nitridation process on overall cell capacitance is illustrated in FIG. 7 which compares the C-V characteristics of test capacitors having plasma nitridation to that of a corresponding control capacitor having conventional processing (ie. no plasma nitridation). C-V curves of similar capacitors having 30 seconds plasma nitridation (40) and 200 seconds plasma nitridation (42) clearly display large shifts of the C-V characteristics compared to that of a control capacitor having no fixed charge (38). There is however, an observable decrease in cell capacitance for the capacitors having plasma nitridation as shown by the curves 40 and 42. This decrease is believed to be caused by surface smoothing from the plasma nitridation process and a possible lower dielectric constant from the non-stoichiometric nitride interlayer. Thus, an optimum plasma nitridation process would represent a balance between the magnitude of the fixed charge density introduced by the plasma nitridation process and any consequent capacitance attenuation. For example, a series of C-V test curves such as shown in FIG. 7 will readily determine a maximal average capacitance over a predetermined voltage range, thus determining an optimal time for plasma nitridation.

While preferred embodiments of this invention have been disclosed herein, those skilled in the art will appreciate that changes and modifications may be made therein without departing from the spirit and scope of the invention as defined in the appended claims.

What is claimed is:

1. A capacitor in an integrated circuit comprising:
    a first electrode having a fixed charge density disposed in a top surface region of the first electrode;
    a dielectric layer directly contacting the top surface region; and
    a second electrode directly contacting the dielectric layer.

2. The capacitor of claim 1, wherein the capacitor has a capacitance greater than 5 fF/$\mu m^2$.

3. The capacitor of claim 1, wherein the top surface region has a textured surface morphology.

4. The capacitor of claim 1, wherein the first electrode is comprised of conductively doped polysilicon.

5. The capacitor of claim 1, wherein the top surface region is comprised of a substantially silicon-rich silicon nitride composition.

6. The capacitor of claim 5, wherein the fixed charge density comprises ionized atomic species in said silicon nitride composition.

7. The capacitor of claim 1, wherein the fixed charge density is at least $10^{11}$/cm$^2$.

8. The capacitor of claim 1, wherein the dielectric layer is comprised of substantially silicon nitride.

* * * * *